United States Patent
Han (10) Patent No.: US 12,382,636 B2
(45) Date of Patent: Aug. 5, 2025

(54) SEMICONDUCTOR DEVICE INCLUDING SELECTOR LAYER

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 487 days.

(21) Appl. No.: 17/942,126

(22) Filed: Sep. 10, 2022

(65) Prior Publication Data

US 2023/0301095 A1    Sep. 21, 2023

(30) Foreign Application Priority Data

Mar. 18, 2022  (KR) .................. 10-2022-0033885

(51) Int. Cl.
*H10B 43/27*    (2023.01)
*H10B 43/30*    (2023.01)

(52) U.S. Cl.
CPC .............. *H10B 43/27* (2023.02); *H10B 43/30* (2023.02)

(58) Field of Classification Search
CPC ........ H10B 43/27; H10B 43/30; H10B 63/80; H10B 63/845; H10B 63/20; H10N 70/25; H10N 70/826; H10N 70/8833; H10N 50/10; H10N 50/85; G11C 2213/15; G11C 2213/51; G11C 2213/54; G11C 2213/71; G11C 2213/73; G11C 2213/76; G11C 13/003; G11C 13/0004; G11C 13/004; G11C 13/0069
See application file for complete search history.

(56) References Cited

U.S. PATENT DOCUMENTS 8,766,234 B1 *   7/2014   Hashim .................. H10B 63/22
                                                  365/163
11,201,214 B2 * 12/2021   Tak ..................... H10D 30/6757

FOREIGN PATENT DOCUMENTS

KR   10-2020-0032766 A   3/2020

* cited by examiner

*Primary Examiner* — Allison Bernstein (57) ABSTRACT

A semiconductor device may include: a first conductive layer; a second conductive layer spaced apart from the first conductive layer; a tunnel insulating layer interposed between the first conductive layer and the second conductive layer and disposed adjacent to the first conductive layer; a charge blocking layer interposed between the first conductive layer and the second conductive layer and disposed adjacent to the second conductive layer; and a selector layer interposed between the tunnel insulating layer and the charge blocking layer, wherein the semiconductor device functions as a self-selecting memory.

13 Claims, 7 Drawing Sheets

SEMICONDUCTOR DEVICE INCLUDING SELECTOR LAYER

CROSS-REFERENCE TO RELATED APPLICATION

This application claims priority under 35 U.S.C. § 119 to Korean Patent Application No. 10-2022-0033885 filed on Mar. 18, 2022 in the Korean Intellectual Property Office, which is incorporated herein by reference in its entirety.

BACKGROUND

1. Technical Field

This patent document relates to memory circuits or memory devices and their applications in electronic devices or electronic systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for such semiconductor devices. Such semiconductor devices include semiconductor devices that can store data using a characteristic in which resistant states can be switched according to an applied voltage or current to result in different resistant states. Examples of these semiconductor devices include, an RRAM (resistive random access memory), a PRAM (phase change random access memory), an FRAM (ferroelectric random access memory), an MRAM (magnetic random access memory), an E-fuse, etc.

SUMMARY

In an embodiment, a semiconductor device may include: a first conductive layer; a second conductive layer spaced apart from the first conductive layer; a tunnel insulating layer interposed between the first conductive layer and the second conductive layer and disposed adjacent to the first conductive layer; a charge blocking layer interposed between the first conductive layer and the second conductive layer and disposed adjacent to the second conductive layer; and a selector layer interposed between the tunnel insulating layer and the charge blocking layer, wherein the semiconductor device functions as a self-selecting memory.

In another embodiment, a semiconductor device may include: a tunnel insulating layer; a charge blocking layer; and a selector layer interposed between the tunnel insulating layer and the charge blocking layer, wherein the semiconductor device switches between different resistance states depending on whether charges are trapped to trap sites of the selector layer.

DETAILED DESCRIPTION

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but the description or illustration may also represent a structure where one or more other intermediate layers may exist between the first layer and the second layer or the substrate.

Figure 1:
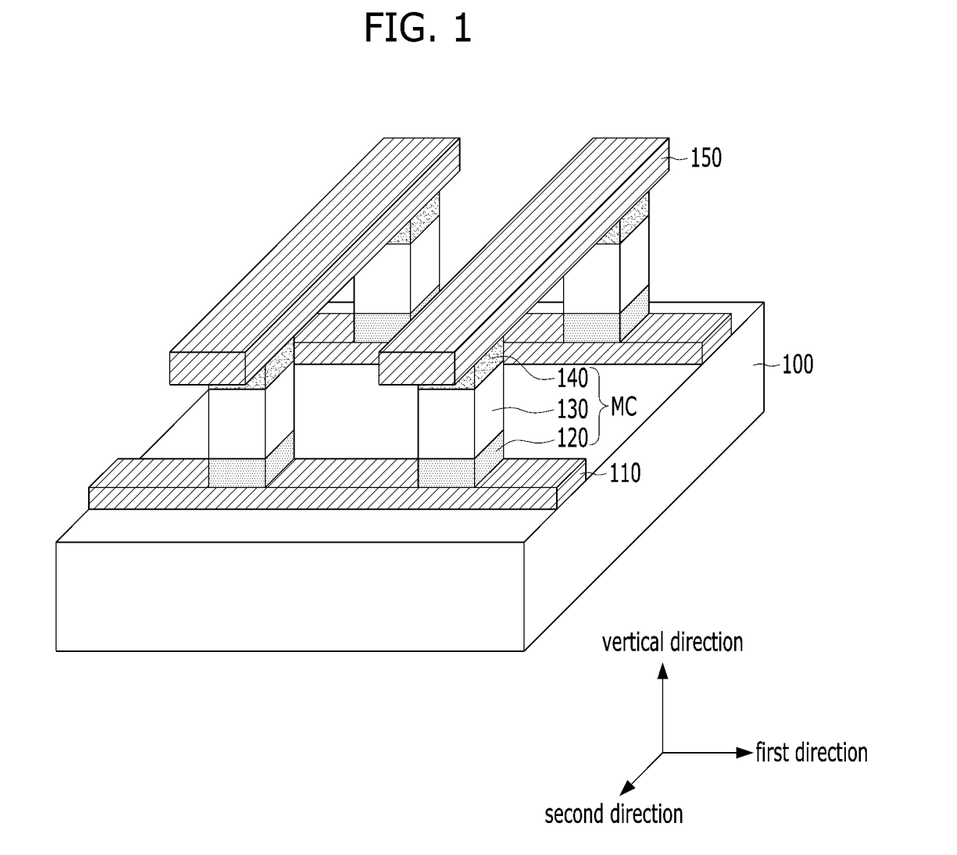
FIG. 1 is a perspective view illustrating a semiconductor device according to an embodiment of the present disclosure.

FIG. 1 is a perspective view illustrating a semiconductor device according to an embodiment of the present disclosure.

Referring to FIG. 1, a semiconductor device may include a plurality of first conductive lines 110 disposed over a substrate 100 and extending in parallel to each other in a first direction, a plurality of second conductive lines 150 disposed over the plurality of first conductive lines 110 to be spaced apart vertically from the plurality of first conductive lines 110 and extending in parallel to each other in a second direction intersecting the first direction, and memory cells MC disposed between the first conductive lines 110 and the second conductive lines 150 to respectively overlap intersecting regions of the first conductive lines 110 and the second conductive lines 150. The first direction and the second direction may be horizontal directions parallel to a surface of the substrate 100.

The substrate 100 may include a semiconductor material such as silicon. In addition, the substrate 100 may include a desired lower structure (not shown). For example, the substrate 100 may include driving circuits that are electrically connected to the first conductive line 110 and the second conductive line 150 to drive them.

The memory cell MC may have a pillar shape and may be separated from an adjacent memory cell MC. In FIG. 1, the memory cell MC is illustrated with a quadrangular pillar shape that has both sidewalls aligned with both sidewalls of the second conductive line 150 in the first direction and both sidewalls aligned with both sidewalls of the first conductive line 110 in the second direction. However, the present disclosure is not limited thereto, and in other embodiments, the memory cell MC may have a circular pillar shape or the like.

The memory cell MC may include a stacked structure of a tunnel insulating layer 120, a selector layer 130, and a charge blocking layer 140, and thus may operate as a self-selecting memory that functions as a memory element and a selector at the same time. More specifically, the self-selecting memory may have a variable resistance characteristic to store different data by switching between different resistance states according to a voltage applied to both ends of the memory cell MC, that is, the first conductive line 110 and the second conductive line 150. At the same time, the self-selecting memory may have a threshold switching characteristic, that is, a characteristic for blocking or substantially limiting a current when a magnitude of an applied voltage is less than a predetermined threshold value and for allowing a current to abruptly increase above the threshold value. This threshold value may be referred to as a threshold voltage, and the self-selecting memory may be implemented in a turned-on state or a turned-off state based on the threshold voltage.

The threshold voltage of the self-selecting memory may depend on the resistance state of the self-selecting memory. That is, the self-selecting memory may have different threshold voltages according to different resistance states. For example, when the self-selecting memory is in a low resistance state, it may have a first threshold voltage, and when the self-selecting memory is in a high resistance state, it may have a second threshold voltage different from the first threshold voltage. Accordingly, it may be possible for the self-selecting memory to simultaneously perform a function as a memory element and a function as a selector.

As a result, data may be stored in each of the plurality of memory cells MC functioning as the self-selecting memory, and current leakage that may occur between the memory cells MC sharing the first conductive line 110 or the second conductive line 150 may be prevented or reduced.

According to embodiments disclosed herein, since the memory cell MC simultaneously performs a function as a memory element and a function as a selector, there is no need to additionally manufacture another memory element or another selector, thereby simplifying the manufacturing process. In addition, because it is easy to implement a memory device having a cross-point structure that includes memory cells MC, the degree of integration of the memory device may be increased and secured.

Hereinafter, a detailed structure of the memory cell MC including the tunnel insulating layer 120, the selector layer 130, and the charge blocking layer 140, and how the memory cell MC functions as a self-selecting memory, will be described in more detail.

Figure 2:
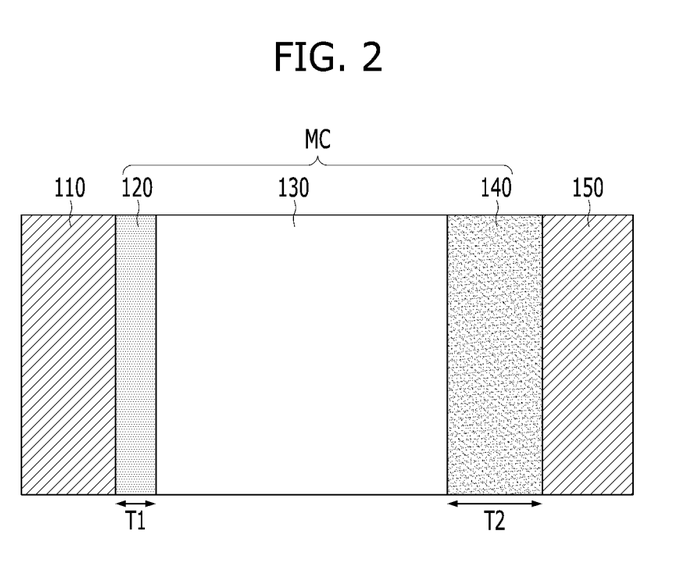
FIG. 2 is a cross-sectional view illustrating a memory cell of FIG. 1 in more detail.

FIG. 2 is a cross-sectional view illustrating a memory cell of FIG. 1 in more detail.

Referring to FIG. 2, the memory cell MC may be interposed between the first conductive line 110 and the second conductive line 150, and may include the tunnel insulating layer 120, the selector layer 130, and the charge blocking layer 140.

Each of the first conductive line 110 and the second conductive line 150 may include various conductive materials, for example, a metal such as platinum (Pt), tungsten (W), aluminum (Al), copper (Cu), tantalum (Ta), titanium (Ti) or the like, a metal nitride such as titanium nitride (TiN) or tantalum nitride (TaN), or a combination thereof.

The tunnel insulating layer 120 may be disposed relatively adjacent to the first conductive line 110 compared to the charge blocking layer 140, and the charge blocking layer 140 may be disposed relatively adjacent to the second conductive line 150 compared to the tunnel insulating layer 120. The selector layer 130 may be disposed between the tunnel insulating layer 120 and the charge blocking layer 140. Although not shown, the memory cell MC may further include an electrode material disposed between the first conductive line 110 and the tunnel insulating layer 120 and/or between the second conductive line 150 and the charge blocking layer 140. The electrode material may include various conductive materials, for example, a metal such as platinum (Pt), tungsten (W), aluminum (Al), copper (Cu), tantalum (Ta), titanium (Ti) or the like, a metal nitride such as titanium nitride (TiN) or tantalum nitride (TaN), or a combination thereof. In another embodiment, the electrode material may include carbon.

The tunnel insulating layer 120 may enable tunneling of charges according to a voltage applied to both ends of the memory cell MC. The tunnel insulating layer 120 may include various insulating materials such as silicon oxide, silicon nitride, or a combination thereof.

The selector layer 130 may function to prevent current leakage that may occur between the memory cells MC sharing the first conductive line 110 or the second conductive line 150. To this end, the selector layer 130 may have a threshold switching characteristic, that is, a characteristic for blocking or substantially limiting a current when a magnitude of a voltage applied to both ends of the selector layer 130 is less than a predetermined threshold value and for allowing a current to abruptly increase above the threshold value. This threshold value may be referred to as a threshold voltage, and the selector layer 130 may be implemented in a turned-on state or a turned-off state based on the threshold voltage. The selector layer 130 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$ or $VO_2$, a tunneling insulating layer having a relatively wide band gap, such as $SiO_2$ or $Al_2O_3$, or the like. In particular, the selector layer 130 may include a material including a plurality of trap sites capable of trapping charges transferred through the tunnel insulating layer 120, such as for example, an OTS material.

The charge blocking layer 140 may substantially block charges trapped in the selector layer 130 from moving toward the second conductive line 150. That is, the charges escaping through the charge blocking layer 140 may be zero or smaller than the amount of the charges tunneling through the tunnel insulating layer 120. The charge blocking layer 140 may include various insulating materials such as silicon oxide, silicon nitride, or a combination thereof. Unlike the tunnel insulating layer 120, the charge blocking layer 140 should suppress the movement of charges as much as possible. Therefore, the tunnel insulating layer 120 and the charge blocking layer 140 may be asymmetrically implemented to have different characteristics. For example, a thickness T2 of the charge blocking layer 140 may be greater than a thickness T1 of the tunnel insulating layer 120. In this case, the tunnel insulating layer 120 and the charge blocking layer 140 may include the same material, for example, silicon dioxide. In another embodiment, the charge blocking layer 140 may include a material having a higher dielectric constant than that of the tunnel insulating layer 120. For example, the tunnel insulating layer 120 may include silicon dioxide, and the charge blocking layer 140 may include a high-k material having a higher dielectric constant than silicon dioxide, such as for example, hafnium dioxide. In another example, the tunnel insulating layer 120 and the charge blocking layer 140 may include a high-k material having a higher dielectric constant than silicon dioxide, and the dielectric constant of the charge blocking layer 140 may be higher than that of the tunnel insulating layer 120. In another embodiment, the charge blocking layer 140 may have a higher dielectric constant than the tunnel insulating layer 120, and a thickness T2 of the charge blocking layer 140 may be greater than the thickness T1 of the tunnel insulating layer 120.

If only the selector layer 130 is applied between the first conductive line 110 and the second conductive line 150, that is, if the tunnel insulating layer 120 and the charge blocking layer 140 are omitted, then the memory cell MC cannot perform a function of storing data, but can only perform a function as a selector. For example, when the selector layer 130 includes an OTS material, if a voltage applied through the first conductive line 110 and the second conductive line 150 reaches a threshold voltage, then electrons may be trapped in the trap sites of the selector layer 130, and thus a rapid current flow through the selector layer 130 may occur. That is, the selector layer 130 may be turned on. On the other hand, if the voltage applied to the first conductive line 110 and the second conductive line 150 is removed, then electrons may be emitted from the trap sites of the selector layer 130 so that the selector layer 130 may be turned off. In this case, the memory cell MC may require an additional memory element.

In the disclosed embodiments, by adding the tunnel insulating layer 120 and the charge blocking layer 140 to both sides of the selector layer 130, the memory cell MC may also function as a memory element. Hereinafter, the function of a memory cell MC will be described in more detail with reference to FIGS. 3A to 3D.

FIGS. 3A to 3D are views illustrating an operation of the memory cell of FIG. 2.

Figure 3A:
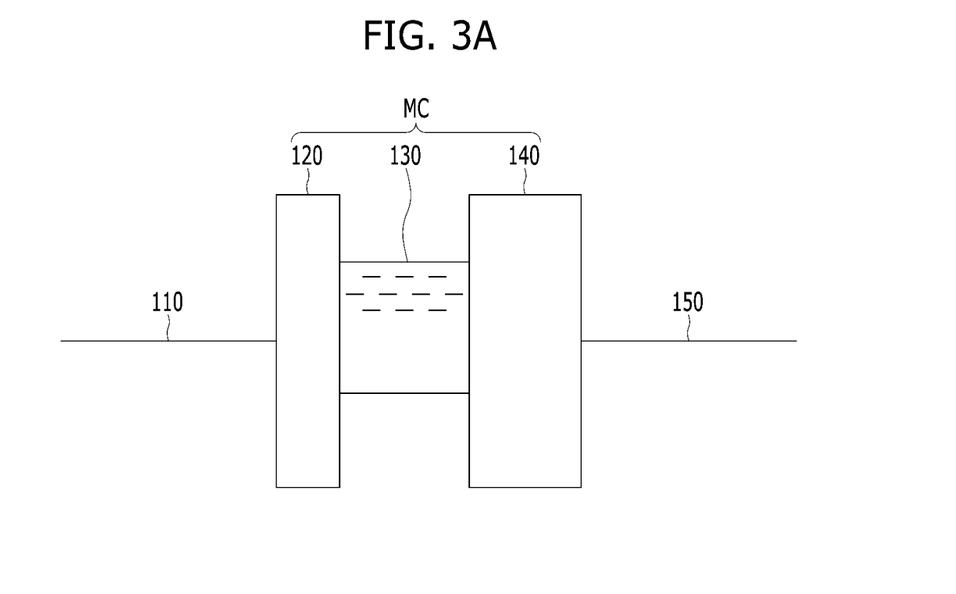
FIGS. 3A to 3D are views illustrating an operation of the memory cell of FIG. 2.

Referring to FIG. 3A, the memory cell MC may have a state in which charges are not trapped in the trap sites in the selector layer 130, that is, a high resistance state. This state may correspond to an initial state immediately after the memory cell MC is manufactured or a state after an erase operation of FIG. 3D to be described later.

When no voltage is applied to the first conductive line 110 and the second conductive line 150, no charge flows through the tunnel insulating layer 120, and as a result a high resistance state may be maintained. The memory cell MC in the high resistance state may have a second threshold voltage.

Figure 3B:
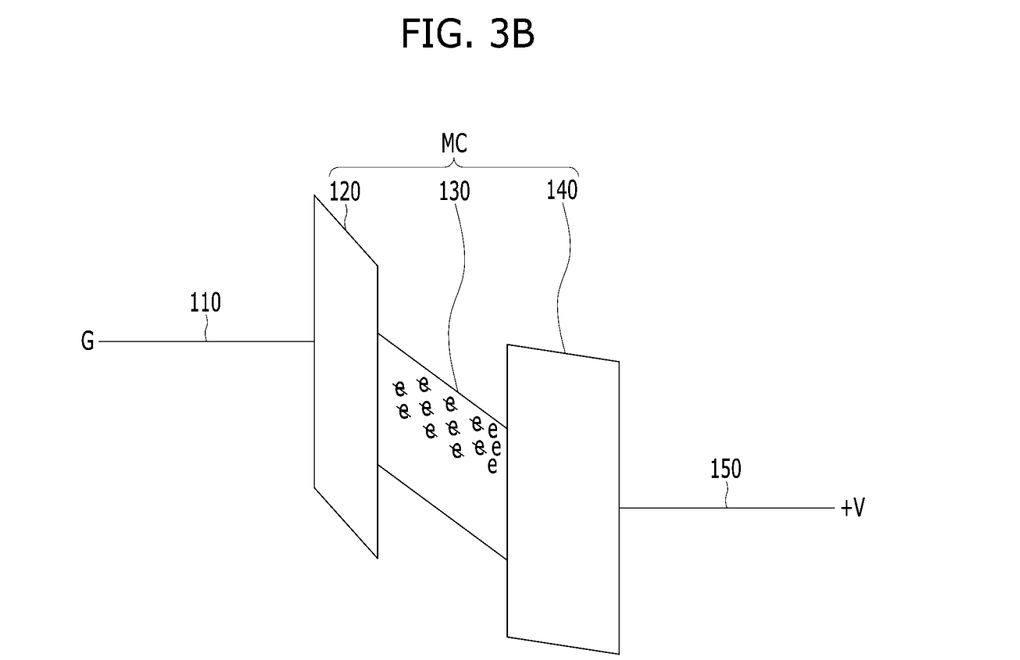

Referring to FIG. 3B, a write operation may be performed by applying a write voltage to the first conductive line 110 and the second conductive line 150. The write operation may refer to an operation of changing the high resistance state of the memory cell MC to a low resistance state. To this end, a relatively positive voltage may be applied to the second conductive line 150 compared to the first conductive line 110. For example, a ground voltage may be applied to the first conductive line 110, and a write voltage indicated by +V may be applied to the second conductive line 150.

During the write operation, charges, such as for example, electrons, may tunnel through the tunnel insulating layer 120 from the first conductive line 110, and may be introduced into the selector layer 130. The charges introduced into the selector layer 130 may be trapped in the trap sites of the selector layer 130. When the charges are trapped in all of the trap sites of the selector layer 130, a rapid current flow through the memory cell MC may occur. That is, the memory cell MC may be changed to the low resistance state.

Figure 3C:
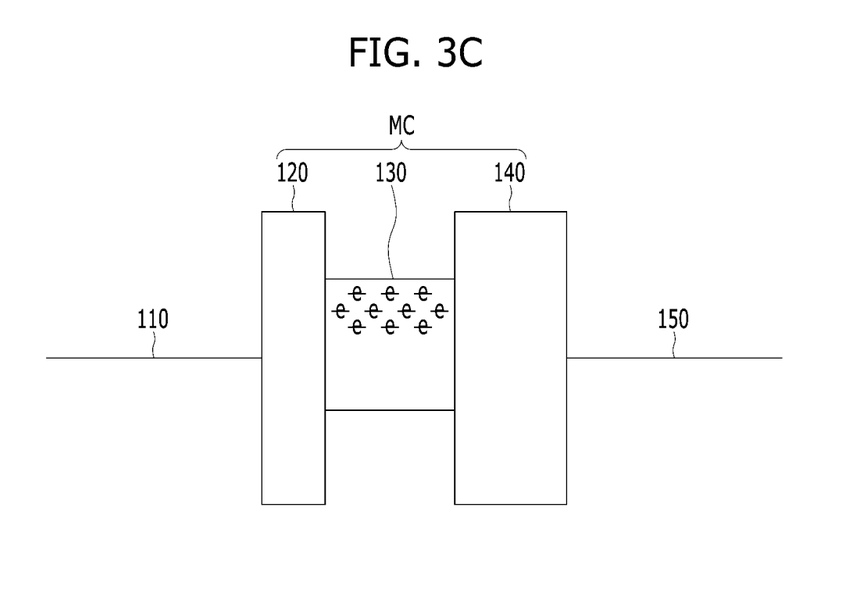

Referring to FIG. 3C, even when the write voltage applied to the first conductive line 110 and the second conductive line 150 is removed, the tunnel insulating layer 120 and the charge blocking layer 140 confine the charges of the selector layer 130, so the memory cell MC may maintain the low resistance state. The memory cell MC in the low resistance state may have a first threshold voltage. The first threshold voltage may be less than the second threshold voltage.

Figure 3D:
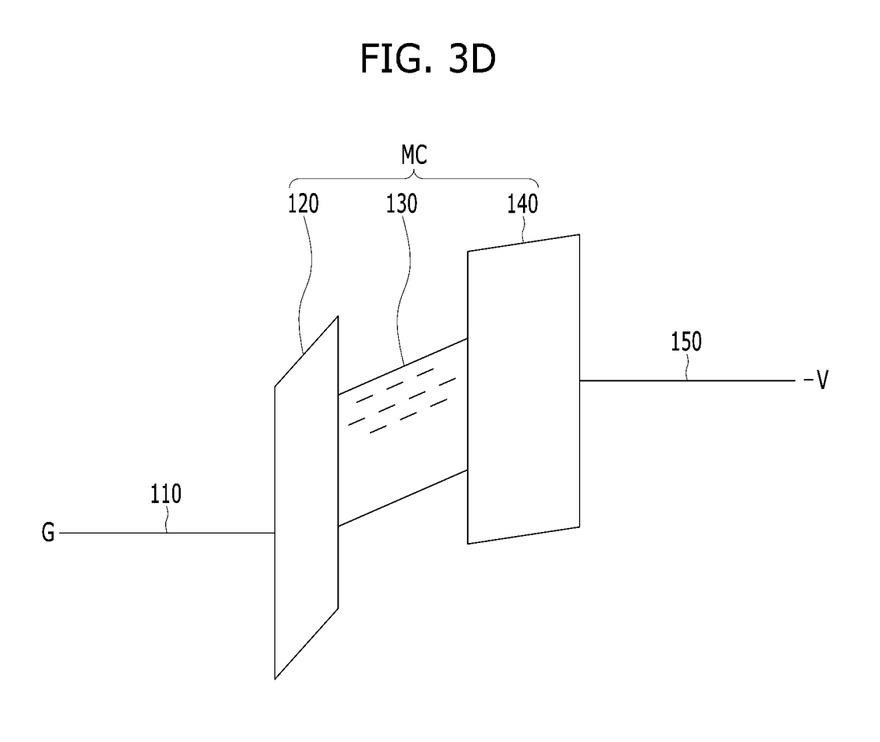

Referring to FIG. 3D, an erase operation may be performed by applying an erase voltage to the first conductive line 110 and the second conductive line 150. The erase operation may refer to an operation of changing the low resistance state of the memory cell MC to the high resistance state. To this end, a relatively negative voltage may be applied to the second conductive line 150 compared to the first conductive line 110. For example, a ground voltage may be applied to the first conductive line 110, and an erase voltage indicated by −V may be applied to the second conductive line 150. The erase voltage may be substantially the same in magnitude as the write voltage, but opposite in polarity.

During the erase operation, the charges of the selector layer 130 may tunnel through the tunnel insulating layer 120 and escape to the first conductive line 110. As a result, the trap sites of the selector layer 130 may be emptied, and current flow through the selector layer 130 may be blocked. That is, the memory cell MC may be changed to the high resistance state to return to a state illustrated in FIG. 3A.

In summary, a write operation in which a negative or positive write voltage is applied results in a memory cell MC having the low resistance state and the relatively small first threshold voltage, and during an erase operation in which the erase voltage having a polarity different from that of the write voltage is applied, the memory cell MC may return to the high resistance state and have the relatively large second threshold voltage.

Figure 4:
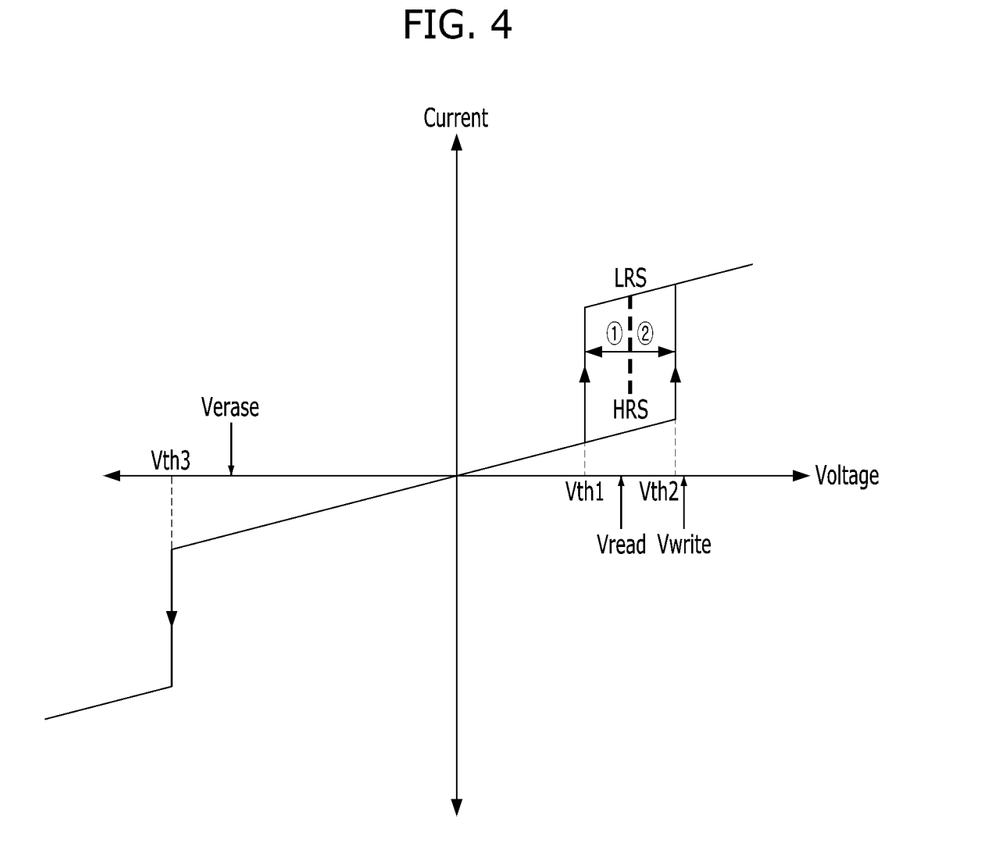
FIG. 4 is a current-voltage graph illustrating an operation of the memory cell of FIG. 2.

FIG. 4 is a current-voltage graph illustrating an operation of the memory cell of FIG. 2.

Referring to FIG. 4, a memory cell in a high resistance state HRS may have a second threshold voltage Vth2, and a memory cell in a low resistance state LRS may have a first threshold voltage Vth1, which has a magnitude smaller than that of the second threshold voltage Vth2.

A write operation and an erase operation on this memory cell may be performed using voltages having the same magnitude and opposite polarities. Accordingly, during the write operation, a positive write voltage Vwrite having a magnitude greater than or equal to the second threshold voltage Vth2 may be applied, and during the erase operation, a negative erase voltage Verase having a magnitude greater than or equal to the second threshold voltage Vth2 may be applied. Here, the write voltage Vwrite may correspond to a voltage indicated by +V in FIG. 3B, and the erase voltage Verase may correspond to a voltage indicated by −V in FIG. 3D.

During a read operation, a read voltage Vread having a magnitude between the first threshold voltage Vth1 and the second threshold voltage Vth2 may be applied. The polarity of the read voltage Vread may be the same as the polarity of the write voltage. That is, a positive read voltage Vread may be applied.

Meanwhile, in order to turn on the memory cell at a negative voltage, a third threshold voltage Vth3 having a magnitude greater than the second threshold voltage Vth2 may be required. This is because charge supply to the selector layer 130 through the charge blocking layer 140 is required to turn on the memory cell at a negative voltage.

Figure 5A:
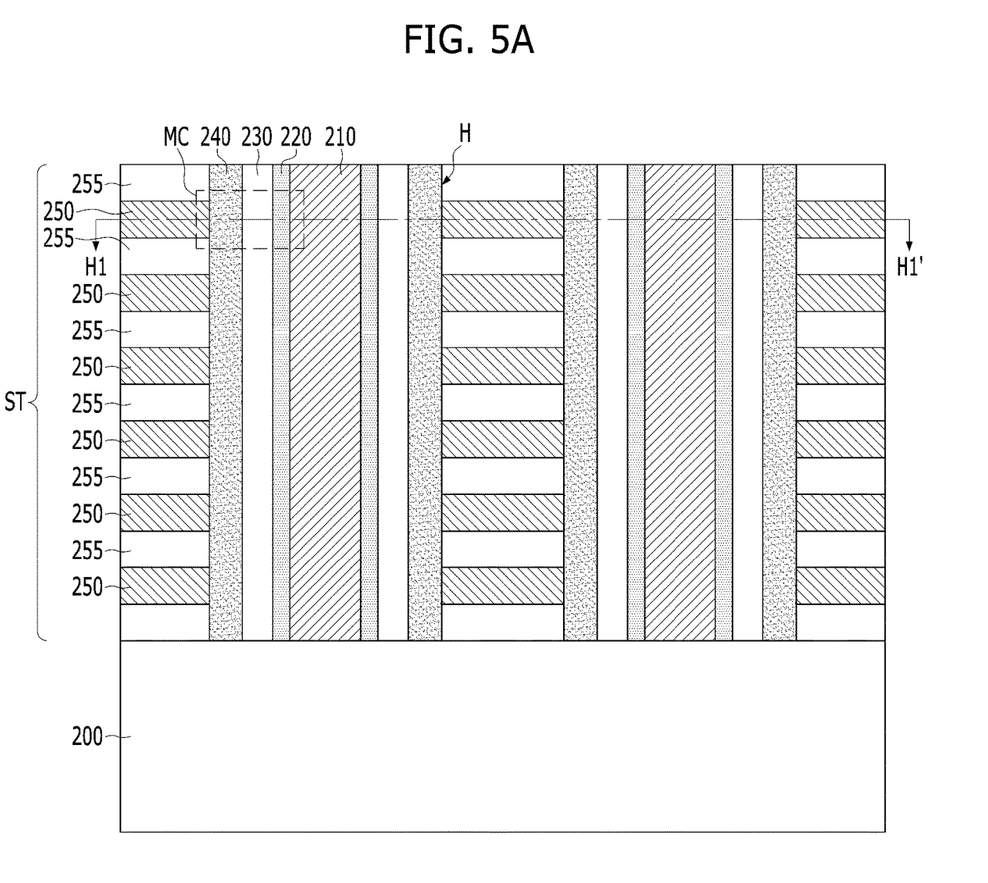
FIGS. 5A and 5B are views illustrating a semiconductor device according to another embodiment of the present disclosure
Figure 5B:
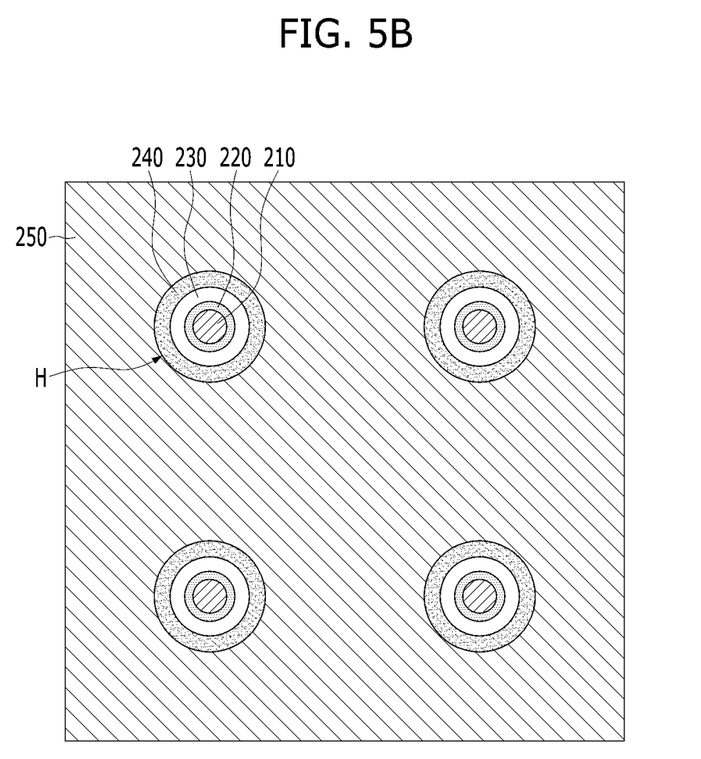

FIGS. 5A and 5B are views illustrating a semiconductor device according to another embodiment of the present disclosure. FIG. 5A is a cross-sectional view, and FIG. 5B is a plan view taken along a line H1-H1' of FIG. 5A. Differences from the above-described embodiment will be mainly described.

Referring to FIGS. 5A and 5B, a stacked structure ST in which a plurality of second conductive layers 250 and a plurality of insulating layers 255 are alternately stacked may be formed over a substrate 200. That is, the plurality of second conductive layers 250 may extend in a horizontal direction parallel to a surface of the substrate 200.

A plurality of holes H penetrating through the stacked structure ST and exposing the substrate 200 may be formed in the stacked structure ST.

A charge blocking layer 240, a selector layer 230, a tunnel insulating layer 220, and a first conductive layer 210 may be sequentially formed over a sidewall of each of the plurality of holes H. Accordingly, the first conductive layer 210 may have a pillar shape extending in a vertical direction perpendicular to the surface of the substrate 200, the tunnel insulating layer 220 may have a shape surrounding a sidewall of the first conductive layer 210, the selector layer 230 may have a shape surrounding a sidewall of the tunnel insulating layer 220, and the charge blocking layer 240 may have a shape surrounding a sidewall of the selector layer 230.

Each of the plurality of second conductive layers 250 may substantially correspond to the second conductive line (refer to 150 of FIG. 1) of the above-described embodiment. Each of the plurality of first conductive layers 210 may substantially correspond to the first conductive line (refer to 110 of FIG. 1) of the above-described embodiment. The charge blocking layer 240, the selector layer 230, and the tunnel insulating layer 220 may substantially correspond to the charge blocking layer (refer to 140 of FIG. 1), the selector layer (refer to 130 of FIG. 1), and the tunnel insulating layer (refer to 120 of FIG. 1) of the above-described embodiment, respectively.

The charge blocking layer 240, the selector layer 230, and the tunnel insulating layer 220 positioned between any one of the first conductive layers 210 and any one of the second conductive layers 250 may form a memory cell MC.

According to the above embodiments of the present disclosure, it may be possible to provide a semiconductor device including a memory cell functioning as a self-selecting memory having excellent operating characteristics and an easy manufacturing process.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:
a first conductive layer;
a second conductive layer spaced apart from the first conductive layer;
a tunnel insulating layer interposed between the first conductive layer and the second conductive layer and disposed adjacent to the first conductive layer;
a charge blocking layer interposed between the first conductive layer and the second conductive layer and disposed adjacent to the second conductive layer; and
a selector layer interposed between the tunnel insulating layer and the charge blocking layer,
wherein the semiconductor device functions as a self-selecting memory,
wherein the charge blocking layer has a thickness greater than a thickness of the tunnel insulating layer, and
wherein the charge blocking layer has a dielectric constant higher than a dielectric constant of the tunnel insulating layer.

2. The semiconductor device according to claim 1, wherein the selector layer includes trap sites capable of trapping charges, and
the semiconductor device switches between a low resistance state and a high resistance state depending on the charges trapped to the trap sites.

3. The semiconductor device according to claim 2, wherein a first threshold voltage of the low resistance state is different from a second threshold voltage of the high resistance state.

4. The semiconductor device according to claim 3, wherein the first threshold voltage is less than the second threshold voltage.

5. The semiconductor device according to claim 3, wherein the semiconductor device is changed from the high resistance state to the low resistance state at a write voltage of a first polarity, and is changed from the low resistance state to the high resistance state at an erase voltage of a second polarity different from the first polarity.

6. The semiconductor device according to claim 5, wherein a magnitude of the write voltage and a magnitude of the erase voltage are the same.

7. The semiconductor device according to claim 5, wherein a magnitude of the write voltage and a magnitude of the erase voltage are equal to or greater than a magnitude of the greater of the first and second threshold voltages.

8. The semiconductor device according to claim 5, wherein, in a read operation for reading a resistance state of the semiconductor device, a read voltage having a magnitude between the first threshold voltage and the second threshold voltage is applied.

9. The semiconductor device according to claim 8, wherein a polarity of the read voltage is the same as the first polarity.

10. The semiconductor device according to claim 1, wherein the first conductive layer is formed over a substrate and extends in a first direction parallel to a surface of the substrate,
the second conductive layer extends in a second direction parallel to the surface of the substrate and intersecting the first direction, and
the tunnel insulating layer, the charge blocking layer, and the selector layer overlap an intersection region of the first conductive layer and the second conductive layer between the first conductive layer and the second conductive layer.

11. The semiconductor device according to claim 1, wherein the first conductive layer includes a plurality of first conductive layers alternately stacked with an insulating layer over a substrate,
the second conductive layer has a pillar shape penetrating the plurality of first conductive layers, and
the tunnel insulating layer, the charge blocking layer, and the selector layer are interposed between the first conductive layer and the second conductive layer.

12. A semiconductor device comprising:
a tunnel insulating layer;
a charge blocking layer; and
a selector layer interposed between the tunnel insulating layer and the charge blocking layer, wherein the semiconductor device switches between different resistance states depending on whether charges are trapped to trap sites of the selector layer, wherein the charge blocking layer has a thickness greater than a thickness of the tunnel insulating layer, and wherein the charge blocking layer has a dielectric constant higher than a dielectric constant of the tunnel insulating layer.

13. The semiconductor device according to claim 12, wherein an amount of charges that tunnel through the tunnel insulating layer is greater than that of the charge blocking layer.

* * * * *